United States Patent
Hwang et al.

(10) Patent No.: US 10,218,151 B1
(45) Date of Patent: Feb. 26, 2019

(54) LASER MODULE PACKAGE WITH DUAL COLORS AND MULTI-DIES

(71) Applicant: ARIMA LASERS CORP., Taoyuan (TW)

(72) Inventors: Jung-Min Hwang, Taoyuan (TW); Yu-Chun Lin, Taoyuan (TW); Chia-Hung Hsieh, Taoyuan (TW); Ming-Cho Wu, Taoyuan (TW)

(73) Assignee: Arima Lasers Corp., Taoyuan (TW)

( * ) Notice: Subject to any disclaimer, the term of this patent is extended or adjusted under 35 U.S.C. 154(b) by 0 days.

(21) Appl. No.: 15/989,475

(22) Filed: May 25, 2018

(51) Int. Cl.
| | |
|---|---|
| *H01S 5/22* | (2006.01) |
| *H01L 33/00* | (2010.01) |
| *F21V 7/00* | (2006.01) |
| *G02B 21/14* | (2006.01) |
| *H01S 5/022* | (2006.01) |
| *H01S 5/40* | (2006.01) |
| *H01S 5/042* | (2006.01) |

(52) U.S. Cl.
CPC ........ *H01S 5/0226* (2013.01); *H01S 5/02288* (2013.01); *H01S 5/02292* (2013.01); *H01S 5/0425* (2013.01); *H01S 5/4031* (2013.01); *H01S 5/4087* (2013.01)

(58) Field of Classification Search
CPC ... H01S 5/0226; H01S 5/02292; H01S 5/4087
See application file for complete search history.

(56) References Cited

U.S. PATENT DOCUMENTS

| | | | | |
|---|---|---|---|---|
| 2003/0043582 A1* | 3/2003 | Chan et al. | ......... | H01S 5/02292 362/259 |
| 2013/0070215 A1* | 3/2013 | Higo | .................... | G03B 21/204 353/85 |
| 2017/0141531 A1* | 5/2017 | Kyono | ................. | G02B 6/4239 |

* cited by examiner

*Primary Examiner* — Tuan N Nguyen
(74) *Attorney, Agent, or Firm* — Rosenberg, Klein & Lee

(57) ABSTRACT

A laser module package with dual colors and multi-dies mainly includes a first PCB arranged in long shape and electrically connected to a plurality of first dies, a second PCB arranged in long shape and electrically connected to a plurality of second dies, a plurality of first collimators correspondingly disposed in a plurality of first openings, and a plurality of second collimators correspondingly disposed in a plurality of second openings. A plurality of first reflectors correspondingly reflects laser beams emitted from the first dies to the first collimators and a plurality of second reflectors correspondingly reflects laser beams emitted from the second dies to the second collimators; or having a plurality of first metal pieces fixing corresponding first dies for the laser beams emitted therefrom to go through the corresponding first collimators and a plurality of second metal pieces fixing corresponding second dies for the laser beams emitted therefrom to go through the corresponding second collimators.

10 Claims, 8 Drawing Sheets

LASER MODULE PACKAGE WITH DUAL COLORS AND MULTI-DIES

BACKGROUND OF THE INVENTION

1. Field of the Invention

The invention relates to a laser module package with dual colors and multi-dies that includes a plurality of first dies electrically connected to a first printed circuit board and a plurality of second dies electrically connected to a second printed circuit board.

2. Description of the Related Art

Conventional projectors have a metal halide bulb as lighting source due to its simple technique and low price, but metal halide bulbs have shortcomings of high temperature, short durability (less than 1000 hours), large volumes, and low efficiency. Currently the mainstream in the field is high pressure mercury arc bulbs. They can last more than 4000 hours of use, but when it comes to 3000 hours, the power is already 40% left due to light attenuation. On the other hand, there are LED light sources that overcome the shortcomings stated above to be applied to projectors. However, LED light sources have a wide angle of light emission (about 120 degrees), causing too much optical loss when they are in use. To avoid all the shortcomings mentioned, semiconductor laser diodes are more suitable for use. They have little volumes, low energy consumption, long durability of 20000 hours, great color purity, and small angle of light emission (less than 20 degrees). Consequently, semiconductor laser diodes have better efficiency in use.

A laser projector is disclosed in US publication No. 2017/0111621. The laser projector has an array of blue laser device 1001 excites a fluorescence wheel 1004 to emit green fluorescence and red fluorescence via a plurality of collimating lens 1002, 1005 and obtains equalized RGB lights by a filter 1007 and an optical equalizing component 1008 as shown in FIG. 1A. The structure has single light source with simple structure, but the red fluorescence powder has low emitting efficiency and attenuates seriously; furthermore, the purity of red color is low.

In order to conquer the defect mentioned above, the inventor further introduces a structure of dual laser light sources as shown in FIG. 1B. The structure has an array of blue laser device 1201 and an array of red laser device 1202 excite a fluorescence wheel 1207 to emit green fluorescence via a plurality of collimating lens 1203, 1205, 1208 and obtains equalized RGB lights by an optical equalizing component 1210. Such structure emits colors with purity and the red light emitted therefrom is stable, but the structure requires multi-light sources, resulting in high manufacturing costs with complexity of the structure.

Therefore, it is desirable to provide a laser module package emitting dual colors with multi-dies in a simple structure.

SUMMARY OF THE INVENTION

It is a primary objective of the present invention to provide a laser module package that has a first and second PCBs arranged in long shape and respectively connected to a plurality of first and second dies to provide a laser module with dual colors of laser beams packaged in a single module, thereby reducing the volumes and prime costs of the device applied.

It is another objective of the present invention to provide a laser module package that has two sets of electrodes arranged through a housing thereof. Each set of electrode is connected to one of the PCBs to operate corresponding laser dies, forming a packaged laser module with dual sets of emitting structure and laser beams with a small emitting surface and less amount of electrodes connected.

In order to achieve the above objectives, the laser module package comprises a housing made of metals with an opening arranged at a top thereof and a space therein; at least a first printed circuit board and a second printed circuit board arranged in a long shape and disposed in said space; a plurality of first reflectors and a plurality of second reflectors disposed in said space, respectively along a side of said first and second printed circuit boards; a plurality of first dies and a plurality of second dies respectively emitting a plurality of first laser beams and a plurality of second laser beams to said first reflectors and said second reflectors, a color of said first laser beams being different from a color of said second laser beams, said first and second dies respectively fixed on said first and second printed circuit boards and electrically connected thereto, forming a laser module with dual colors and multi-dies; a cover made of metals to be disposed on said housing and including a plurality of first openings and a plurality of second openings, each first opening arranged at a position correspondingly to a position of one first reflector and each second opening arranged at a position correspondingly to a position of one second reflector; and a plurality of first collimators and a plurality of second collimators, each first collimator disposed in one of said first openings for said first reflectors to reflect a corresponding first laser beam to a corresponding first collimator and each second collimator disposed in one of said second openings for said second reflectors to reflect a corresponding second laser beam to a corresponding second collimator, each of said first and second collimators including a central protrusion and a flat surface surrounding said central protrusion.

In another embodiment, the laser module package comprises a housing made of metals with an opening arranged at a top thereof and a space therein; at least a first printed circuit board and a second printed circuit board arranged in a long shape and disposed in said space; a plurality of first metal pieces and a plurality of second metal pieces respectively disposed on said first and second printed circuit boards; a plurality of first dies electrically connected to the first printed circuit board, each fixed on a side of one corresponding first metal piece; a plurality of second dies electrically connected to the second printed circuit board, each fixed on a side of one corresponding second metal piece, a color of said first laser beams being different from a color of said second laser beams so as to form a laser module with dual colors and multi-dies; a cover made of metals to be disposed on said housing and including a plurality of first openings and a plurality of second openings, each first opening arranged at a position correspondingly to a position of one first metal piece and each second opening arranged at a position correspondingly to a position of one second metal piece; and a plurality of first collimators and a plurality of second collimators, each first collimator disposed in one of said first openings for a corresponding first laser beam to be emitted therethrough, a position of the first dies and a direction of corresponding first laser beams fixed by one of the corresponding first metal pieces, and each second collimator disposed in one of said second openings for a corresponding second laser beam to be emitted therethrough, a position of the second dies and a direction of corresponding second laser beams fixed by corresponding one of the second metal pieces.

Furthermore, the first and second printed circuit boards are ceramic circuit boards. The color of the first laser beams are red and the color of the second laser beams are blue.

The laser module package further has adhesives adhering a pre-determined position on a bottom surface of the cover to a top surface of peripheral wall around the opening of the housing and adhering the flat surfaces of the first and second collimators to a plurality of pre-determined positions on the bottom surface of the cover for the central protrusions of the first and second collimators standing out from the corresponding first and second openings of the cover.

In addition, the laser module package further comprises a set of first electrodes and a set of second electrodes, both made of conductive metals and stretching through two opposite sides of the housing via insulating materials, said first set of electrodes electrically connected to the first printed circuit board with an end and to external circuit with the other end, said set of second electrodes electrically connected to the second printed circuit board with an end and to external circuit with the other end.

With structures disclosed above, the present invention has the single laser module packaged within the housing with two sets of laser dies and electrodes to avoid the complexity of two lighting sources structures and the high costs and to provide dual colors of laser beams to reduce the volume of the structure and the external electrodes needed for connection.

DETAILED DESCRIPTION OF THE PREFERRED EMBODIMENT

Figure 1A:
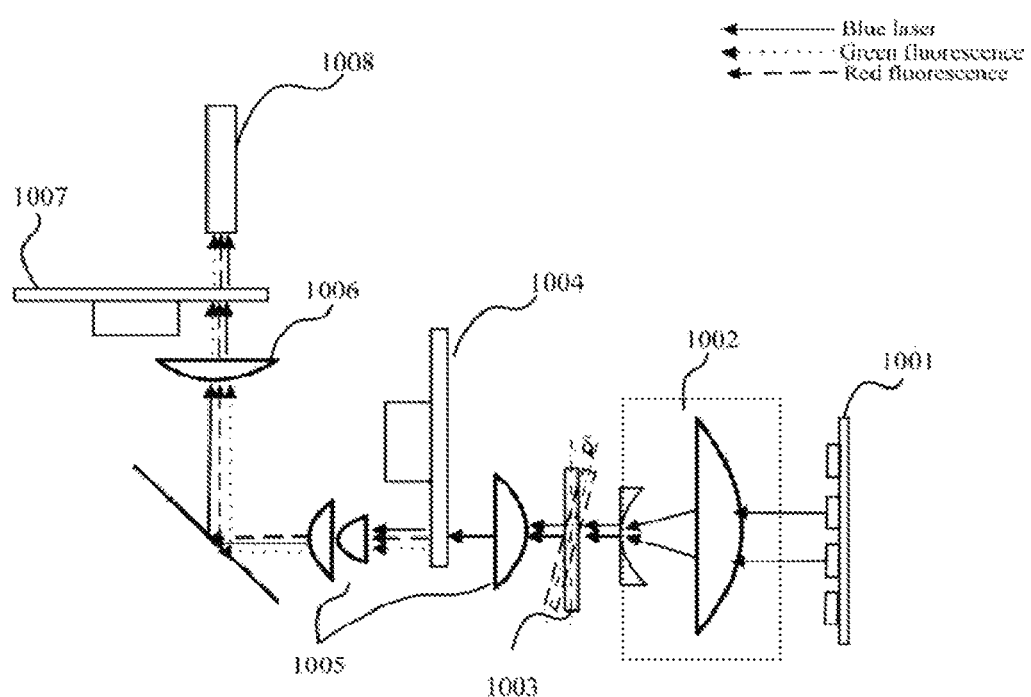
FIG. 1A is a schematic structural diagram of a conventional light emitter emitting green fluorescence and red fluorescence by an array of blue laser.
Figure 1B:
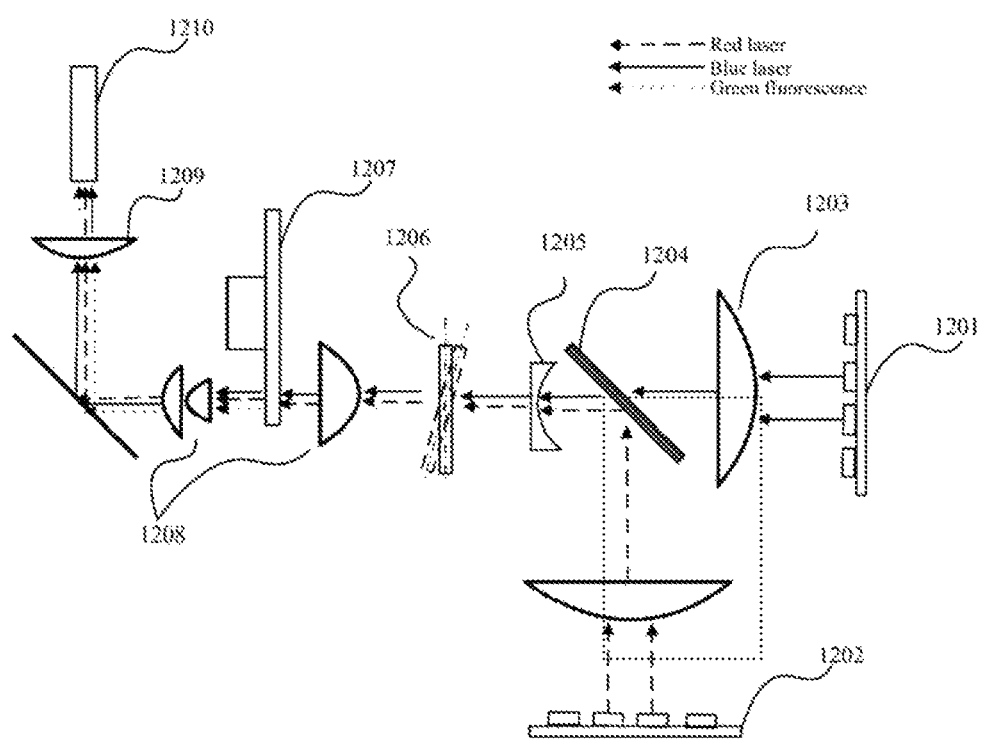
FIG. 1B is a schematic structural diagram of a conventional light emitter emitting green fluorescence by an array of blue laser and an array of red laser.
Figure 2A:
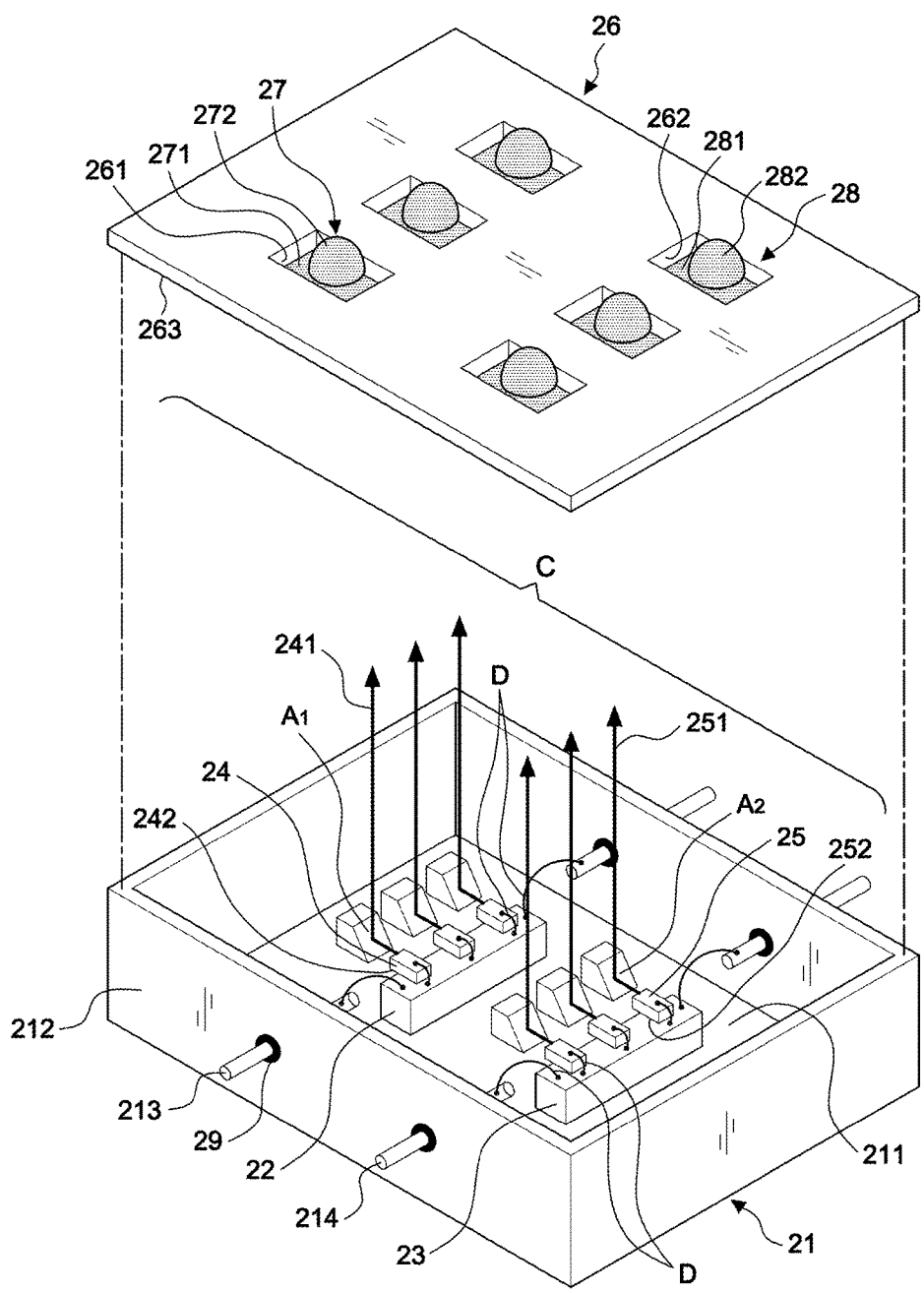
FIG. 2A is an exploded view of the present invention.
Figure 2B:
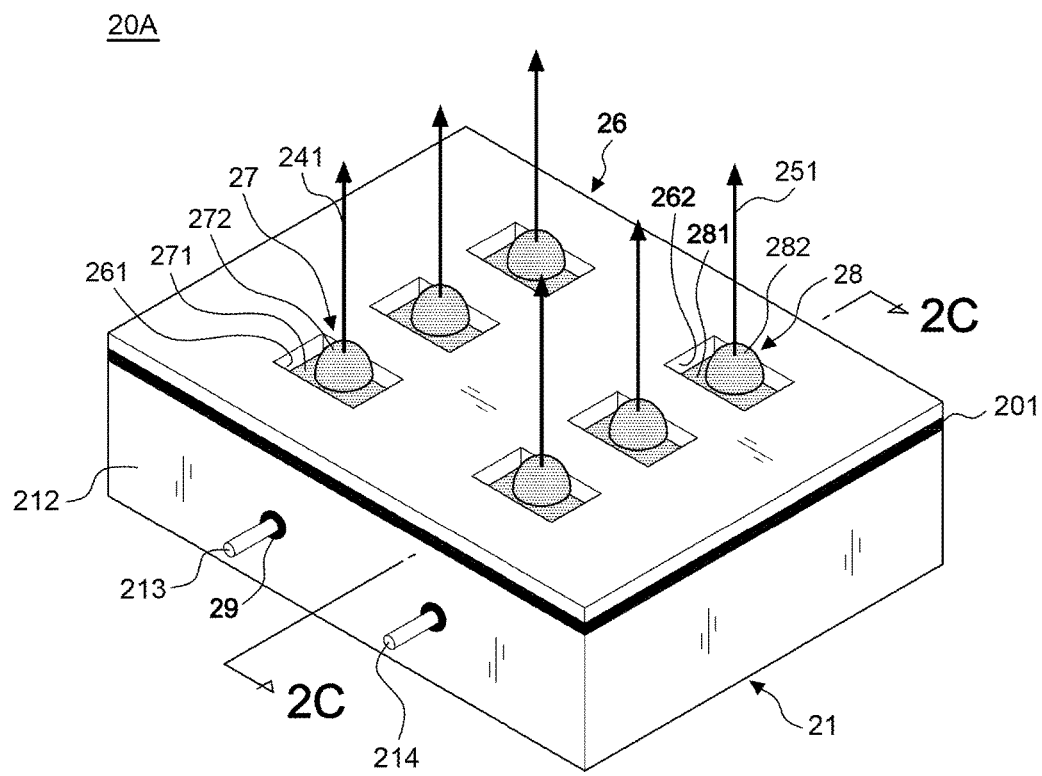
FIG. 2B is a perspective view of the present invention.
Figure 2C:
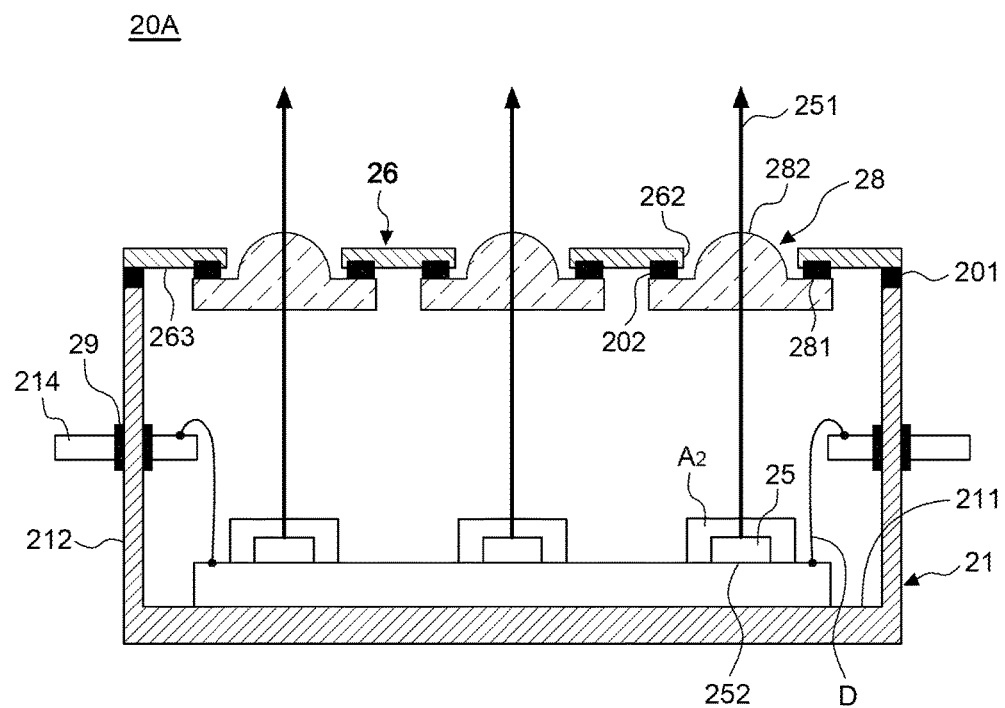
FIG. 2C is a sectional view along line 2C-2C in FIG. 2B.

Referring to FIGS. 2A-2C, in a preferred embodiment, a laser module package with dual colors and multi-dies 20A mainly includes a housing 21, at least one first printed circuit board (PCB) 22, at least one second printed circuit board (PCB) 23, a plurality of first reflectors $A_1$, a plurality of second reflectors $A_2$, a plurality of first dies 24, a plurality of second dies 25, a cover 26, a plurality of first collimators 27 and a plurality of second collimators 28.

The housing 21 is made of metals and has an opening arranged at a top thereof and a space 211 therein. The first PCB 22 and the second PCB 23 are both arranged in a long shape and disposed in the space 211 of the housing 21. The plurality of first reflectors $A_1$ are disposed in the space 211 along a side of the first PCB 22 and the plurality of second reflectors $A_2$ are disposed in the space 211 along a side of the second PCB 23.

The plurality of first dies 24 are fixed on the first PCB 22 for electrical connection via wires D, each emitting a first laser beam 241 to a corresponding first reflector $A_1$. The plurality of second dies 25 are fixed on the second PCB 23 for electrical connection via wires D, each emitting a second laser beam 251 to a corresponding second reflector $A_2$; the color of the first laser beams 241 are different from the color of the second laser beams 251, so as to form a laser module with dual colors and multi-dies C.

The cover 26 is made of metals and disposed on the housing 21, including a plurality of first openings 261 and a plurality of second openings 262. Each of the first openings 261 is arranged at a position correspondingly to a position of one of the first reflectors $A_1$ and each second opening 262 is arranged at a position correspondingly to a position of one of the second reflectors $A_2$. Each first collimator 27 is disposed in a corresponding first opening 261 for a corresponding first reflector $A_1$ to reflect a corresponding first laser beam 241 to the corresponding first collimator 27 and each second collimator 28 is disposed in a corresponding second opening 262 for a corresponding second reflector $A_2$ to reflect a corresponding second laser beam 251 to the corresponding second collimator 28. Furthermore, each of the first and second collimators 27, 28 includes a central protrusion 272, 282 and a flat surface 271, 281 surrounding the central protrusion 272, 282.

Figure 3A:
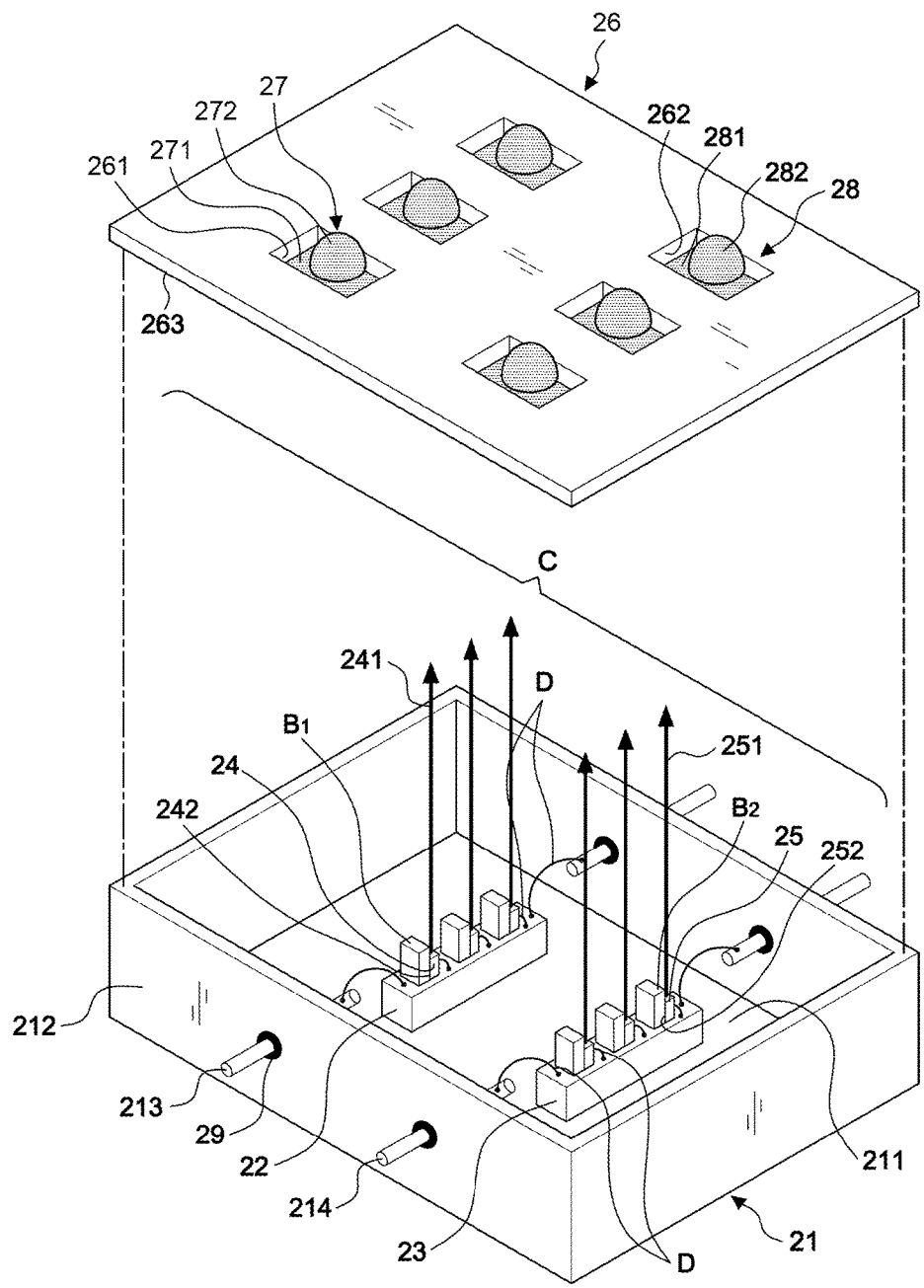
FIG. 3A is another exploded view of the present invention.
Figure 3B:
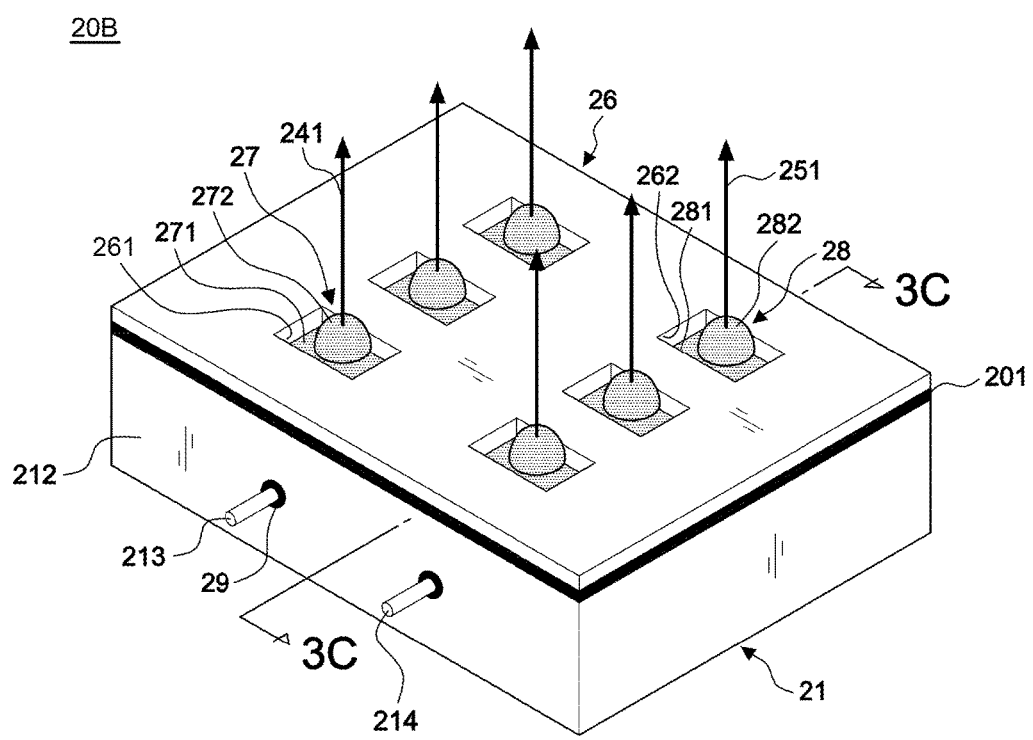
FIG. 3B is another perspective view of the present invention.
Figure 3C:
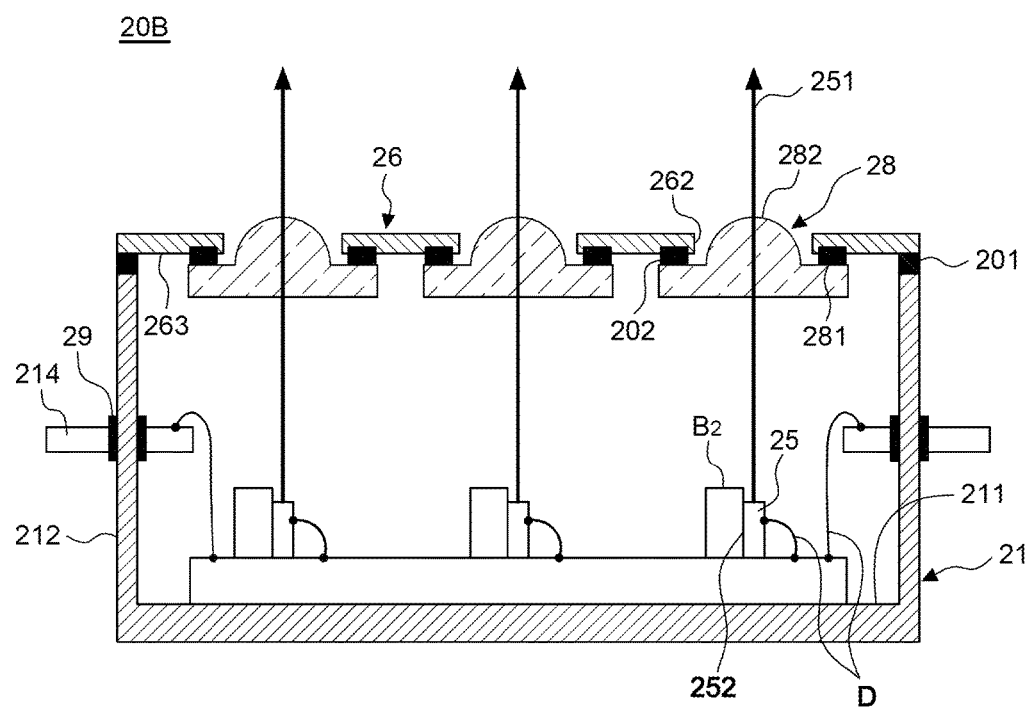
FIG. 3C is a sectional view along line 3C-3C in FIG. 3B.

Referring to FIGS. 3A-3C, in another preferred embodiment, a laser module package with dual colors and multi-dies 20B mainly includes a housing 21, at least one first printed circuit board (PCB) 22, at least one second printed circuit board (PCB) 23, a plurality of first metal pieces $B_1$, a plurality of second metal pieces $B_2$, a plurality of first dies 24, a plurality of second dies 25, a cover 26, a plurality of first collimators 27 and a plurality of second collimators 28.

The housing 21 is made of metals and has an opening arranged at a top thereof and a space 211 therein. The first PCB 22 and the second PCB 23 are both arranged in a long shape and disposed in the space 211 of the housing 21. The plurality of first metal pieces $B_1$ are disposed on the first PCB 22 for electrical connection via wires D and the plurality of second metal pieces $B_2$ are disposed on the second PCB 23 for electrical connection via wires D.

The plurality of first dies 24 are electrically connected to the first PCB 22, each fixed on a side of a corresponding first metal piece $B_1$ and emitting a first laser beam 241. The plurality of second dies 25 are electrically connected to the second PCB 23, each fixed on a side of a corresponding second metal piece $B_2$ and emitting a second laser beam 251; the color of the first laser beams 241 are different from the color of the second laser beams 251, so as to form a laser module with dual colors and multi-dies C.

The cover 26 is made of metals and disposed on the housing 21, including a plurality of first openings 261 and a plurality of second openings 262. Each of the first openings 261 is arranged at a position correspondingly to a position of one of the first metal pieces $B_1$ and each second opening 262 is arranged at a position correspondingly to a position of one of the second metal pieces $B_2$. Each first collimator 27 is disposed in a corresponding first opening 261 for a corresponding first laser beam 241 to be emitted therethrough; a position of the first dies 24 and a direction of the corresponding first laser beams 241 are fixed by their corresponding first metal pieces $B_1$. Each second collimator 28 is disposed in a corresponding second opening 262 for a corresponding second laser beam 251 to be emitted therethrough; a position of the second dies 25 and a direction of the corresponding second laser beams 251 are fixed by their corresponding second metal pieces $B_2$.

Structures of the embodiments stated above are only different in having reflectors or metal pieces for operation. As for other arrangement of the materials and designs, the details are the same as following, but the present invention is not limited to such applications for operation.

The first and second PCBs 22, 23 are ceramic circuit boards. The color of the first laser beams 241 are red and the color of the second laser beams 251 are blue. The present invention further includes a first adhesives 201 adhering a pre-determined position on a bottom surface 263 of the cover 26 to a top surface of peripheral wall around the opening 211 of the housing 21 and a second adhesives 202 adhering the flat surfaces 271, 281 of the first and second collimators 27, 28 to a plurality of pre-determined positions on the bottom surface 263 of the cover 26 for the central protrusions 272, 282 of the first and second collimators 27, 28 standing out from the corresponding first and second openings 261, 262 of the cover 26.

The present invention further includes a set of first electrodes 213 and a set of second electrodes 214, both made of conductive metals and stretching through two opposite side walls 212 of the housing 21 via insulating materials 29. The first electrodes set 213 is electrically connected to the first PCB 22 with an end via wires D and to external circuit with the other end, and the second electrodes set 214 is electrically connected to the second PCB 23 with an end via wires D and to external circuit with the other end.

In short, both embodiments have the laser module with dual colors and multi-dies C packaged in the housing 21 with dual sets of laser dies 24, 25 and dual sets of electrodes 213, 214 to avoid the complex structures of dual lighting sources of laser module and to reduce the manufacturing costs. It has a smaller area of emitting surface and is connected to less external electrodes in comparison with conventional devices. The present invention also has multi-functioning PCBs and reduces the volume of the module and the devices applied.

What is claimed is:

1. A laser module package with dual colors and multi-dies, comprising:
    a housing made of metals with an opening arranged at a top thereof and a space therein;
    at least a first printed circuit board and a second printed circuit board arranged in a long shape and disposed in said space;
    a plurality of first reflectors and a plurality of second reflectors disposed in said space, respectively along a side of said first and second printed circuit boards;
    a plurality of first dies fixed on said first printed circuit board and electrically connected thereto to emit a plurality of first laser beams to said corresponding first reflectors;
    a plurality of second dies fixed on said second printed circuit board and electrically connected thereto to emit a plurality of second laser beams to said corresponding second reflectors, a color of said first laser beams being different from a color of said second laser beams, so as to form a laser module with dual colors and multi-dies;
    a cover made of metals to be disposed on said housing and including a plurality of first openings and a plurality of second openings, each first opening arranged at a position correspondingly to a position of one of the first reflectors and each second opening arranged at a position correspondingly to a position of one of the second reflectors; and
    a plurality of first collimators and a plurality of second collimators, each first collimator disposed in one of said first openings for said first reflectors to reflect a corresponding first laser beam to a corresponding first collimator and each second collimator disposed in one of said second openings for said second reflectors to reflect a corresponding second laser beam to a corresponding second collimator, each of said first and second collimators including a central protrusion and a flat surface surrounding said central protrusion.

2. The laser module package with dual colors and multi-dies as claimed in claim 1, wherein the first and second printed circuit boards are ceramic circuit boards.

3. The laser module package with dual colors and multi-dies as claimed in claim 1, wherein the color of the first laser beams are red and the color of the second laser beams are blue.

4. The laser module package with dual colors and multi-dies as claimed in claim 1, wherein the laser module package further having adhesives adhering a pre-determined position on a bottom surface of the cover to a top surface of peripheral wall around the opening of the housing and adhering the flat surfaces of the first and second collimators to a plurality of pre-determined positions on the bottom surface of the cover for the central protrusions of the first and second collimators standing out from the corresponding first and second openings of the cover.

5. The laser module package with dual colors and multi-dies as claimed in claim 1, wherein the laser module package further comprising a set of first electrodes and a set of second electrodes, both made of conductive metals and stretching through two opposite sides of the housing via insulating materials, said first electrodes set electrically connected to the first printed circuit board with an end and to external circuit with the other end, said second electrodes set electrically connected to the second printed circuit board with an end and to external circuit with the other end.

6. A laser module package with dual colors and multi-dies, comprising:
    a housing made of metals with an opening arranged at a top thereof and a space therein;
    at least a first printed circuit board and a second printed circuit board arranged in a long shape and disposed in said space;
    a plurality of first metal pieces and a plurality of second metal pieces respectively disposed on said first and second printed circuit boards;
    a plurality of first dies electrically connected to the first printed circuit board, each fixed on a side of one corresponding first metal piece;
    a plurality of second dies electrically connected to the second printed circuit board, each fixed on a side of one corresponding second metal piece, a color of said first laser beams being different from a color of said second laser beams, so as to form a laser module with dual colors and multi-dies;
    a cover made of metals to be disposed on said housing and including a plurality of first openings and a plurality of second openings, each first opening arranged at a position correspondingly to a position of one of the first metal pieces and each second opening arranged at a position correspondingly to a position of one of the second metal pieces; and
    a plurality of first collimators and a plurality of second collimators, each first collimator disposed in one of said first openings for a corresponding first laser beam to be emitted therethrough, a position of the first dies and a direction of corresponding first laser beams fixed by one of the corresponding first metal pieces, and each second collimator disposed in one of said second openings for a corresponding second laser beam to be emitted therethrough, a position of the second dies and a direction of corresponding second laser beams fixed by one of the corresponding second metal pieces.

7. The laser module package with dual colors and multi-dies as claimed in claim 6, wherein the first and second printed circuit boards are ceramic circuit boards.

8. The laser module package with dual colors and multi-dies as claimed in claim 6, wherein the color of the first laser beams are red and the color of the second laser beams are blue.

9. The laser module package with dual colors and multi-dies as claimed in claim 6, wherein the laser module package further having adhesives adhering a pre-determined position on a bottom surface of the cover to a top surface of peripheral wall around the opening of the housing and adhering the flat surfaces of the first and second collimators to a plurality of pre-determined position on the bottom surface of the cover for the central protrusions of the first and second collimators standing out from the corresponding first and second openings of the cover.

10. The laser module package with dual colors and multi-dies as claimed in claim 6, wherein the laser module package further comprising a set of first electrodes and a set of second electrodes, both made of conductive metals and stretching through two opposite sides of the housing via insulating materials, said first set of electrodes electrically connected to the first printed circuit board with an end and to external circuit with the other end, said set of second electrodes electrically connected to the second printed circuit board with an end and to external circuit with the other end.

* * * * *